(12) United States Patent
Narasimhan

(10) Patent No.: US 7,346,135 B1
(45) Date of Patent: Mar. 18, 2008

(54) COMPENSATION FOR RESIDUAL FREQUENCY OFFSET, PHASE NOISE AND SAMPLING PHASE OFFSET IN WIRELESS NETWORKS

(75) Inventor: Ravi Narasimhan, Los Altos, CA (US)

(73) Assignee: Marvell International, Ltd., Hamilton (BM)

( * ) Notice: Subject to any disclaimer, the term of this patent is extended or adjusted under 35 U.S.C. 154(b) by 676 days.

(21) Appl. No.: 10/193,439

(22) Filed: Jul. 10, 2002

Related U.S. Application Data

(60) Provisional application No. 60/356,475, filed on Feb. 13, 2002.

(51) Int. Cl.
 H03D 1/04 (2006.01)
(52) U.S. Cl. ............... 375/346; 375/130; 375/149; 375/354; 375/355
(58) Field of Classification Search ............ 375/149, 375/130, 354, 355, 346
See application file for complete search history.

(56) References Cited

U.S. PATENT DOCUMENTS

| | | | |
|---|---|---|---|
| 5,345,440 A | 9/1994 | Gledhill et al. | |
| 5,450,456 A | 9/1995 | Mueller | |
| 5,608,764 A | 3/1997 | Sugita et al. | |
| 5,640,431 A | 6/1997 | Bruckert et al. | |
| 5,732,113 A | 3/1998 | Schmidl et al. | |
| 5,732,339 A | 3/1998 | Auvray et al. | |
| 5,838,734 A * | 11/1998 | Wright | 375/316 |
| 5,889,759 A | 3/1999 | McGibney | |
| 6,035,003 A | 3/2000 | Park et al. | |
| 6,198,782 B1 | 3/2001 | De Courville et al. | |
| 6,658,063 B1 * | 12/2003 | Mizoguchi et al. | 375/260 |
| 2001/0031022 A1 | 10/2001 | Petrus et al. | |
| 2002/0065047 A1 * | 5/2002 | Moose | 455/63 |
| 2002/0085651 A1 * | 7/2002 | Gu | 375/344 |
| 2002/0101840 A1 * | 8/2002 | Davidsson et al. | 370/330 |

FOREIGN PATENT DOCUMENTS

FI   EP 1 160 981 A2   5/2001

OTHER PUBLICATIONS

Abramowitz, "Handbook of Mathematical Functions", 1972, Dover, pp. 69.*
Eli Maor, "e The Story of a number", 1994, Princeton University Press, p. 172.*
Simoens, "A new method for joint cancellation of clock and carrier frequency offsets in OFDM receivers over frequency selective channels", IEEE 51st Vehicular Technology Conference Proceedings, 2000. VTC 2000-Spring Tokyo. 2000 vol. 1, May 15-18, 2000 pp. 390-394 vol. 1.*
In ho Hwang, "Frequency and timing period offset estimation technique for OFDM systems", Electronics Letters, vol. 34, Issue 6, Mar. 19, 1998 pp. 520-521.*

(Continued)

*Primary Examiner*—Mohammed Ghayour
*Assistant Examiner*—Juan Alberto Torres

(57) ABSTRACT

Improved performance, particularly gain in SNR, in high-bandwidth OFDM receivers, software and systems is achieved by compensating channel estimates not only for carrier frequency offset and phase noise, but also for interference caused by sample phase jitter. At high bandwidths, e.g. using 256 QAM symbol constellation, significant SNR improvement is gained by determining and applying a corresponding compensation to each data sub-carrier channel, the compensation preferably including a term that increases linearly with the sub-carrier index.

56 Claims, 8 Drawing Sheets

OTHER PUBLICATIONS

Thierry Pollet and Marc Moeneclaey, "Syncronizability of OFDM Signals," Communication Engineering Lab, University of Ghent, St. Pietersnieuwstraat 41, B-9000 Ghent, Belgium, IEEE 1995.

IEEE std. 802.11a—1999, *Sponsor LAN MAN Standards Committee of IEEE Computer Society*, "Part 11: Wireless LAN Medium Access Control (MAC) and Physical Layer (PHY) Specifications, High-Speed Physical Layer in the 5 GHz Band".

IEEE std. 802.11b—1999, *Sponsor LAN MAN Standards Committee of IEEE Computer Society*, "Part 11: Wireless LAN Medium Access Control (MAC) and Physical Layer (PHY) Specifications, Higher-Speed Physical Layer Extension in 2.4 GHz Band," Ch. 18 (pp. 11-58).

ANSI/IEEE Std 802.11, 1999 Edition, *Sponsor LAN MAN Standards Committee of IEEE Computer Society*, "Part 11: Wireless LAN Medium Access Control (MAC) and Physical Layer (PHY) Specifications," Ch. 12 (pp. 138-146), Ch. 13 (pp. 147), Ch. 15 (pp. 195-223).

ANSI/IEEE Std 802.11g/D2, Draft 2002 Edition, *Sponsor LAN MAN Standards Committee of IEEE Computer Society*, "Further Higher-Speed Physical Layer Extension in the 2.4 GHz Band."

* cited by examiner

COMPENSATION FOR RESIDUAL FREQUENCY OFFSET, PHASE NOISE AND SAMPLING PHASE OFFSET IN WIRELESS NETWORKS

RELATED APPLICATION

This application claims priority under 35 USC § 119(e)(1) from U.S. Provisional Application Ser. No. 60/356,475 filed Feb. 13, 2002, which is incorporated herein fully by reference.

TECHNICAL FIELD

The invention is in the field of wireless communications and, more specifically, pertains to improved performance in an OFDM receiver physical layer implementation by fine tuning each channel estimate to compensate for sample phase jitter.

BACKGROUND OF THE INVENTION

The wireless local area network or WLAN is expanding rapidly into a wide variety of implementations and applications. This rapid growth is attributable to several factors, including improved accuracy (lower BER), increased bandwidth and falling costs. While wireless networking was considered fairly exotic and certainly expensive just a few years ago, it is rapidly gaining users in all markets. Commercial enterprises can avoid considerable wiring costs by deploying wireless networks in their buildings and campuses. Even families and home office workers now enjoy the benefits of wireless networks, as the cost of an access point has fallen below $100 at retail and an individual WLAN "station" costs around $50. (A station or "client" has a MAC and a PHY, and connects to the wireless medium. Common implementations include standard PC-type circuit boards and PCM cards.)

High manufacturing volumes, lower costs, and technical improvements to a large degree can all be traced to standardization. The IEEE established the 802.11 Working Group in 1990, and has promulgated various standards in this area in recent years. In 1999, the IEEE-SA Standards Board approved the 2.4 GHz, 11 Mbps 802.11b and the 5 GHz, 54 Mbps 802.11a high-rate PHY extensions. These two standards have relatively identical MAC layers, but different PHY layers. The IEEE Standard 802.11 (1999), the IEEE Standard 802.11a (1999) and 802.11b (1999) high-rate PHY Supplements, and the 802.11g (draft 2002) high-rate PHY Supplement are incorporated herein fully by reference.

The lower bandwidth 802.11b standard was first to be widely implemented, fueling considerable growth and competition in the WLAN industry. That system has several drawbacks, however. The 2.4 GHz (unlicensed) band is very congested, hosting everything from wireless telephones to Bluetooth transceivers to microwave ovens. (Although the maximum packet length in the 802.11 protocol was designed to operate between the 8 msec pulses of the microwave oven magnetron.) The 2.4 Gz system provides limited numbers of channels (three non-overlapping) and bandwidth limited to 11 Mbps best case.

The 5 GHz ("Wi-Fi5") band is relatively clean. The 802.11a extension provides for 8 non-overlapping channels (plus 4 channels in the upper band), and improved bandwidth up to 54 Mbps. Systems can provide higher bandwidths, and still be compliant, as long as they implement at least the mandatory data rates, namely 6, 12, and 24 Mbps.

Some manufacturers are offering "dual band" systems that implement both 802.11b and 802.11a standards. Because of differences in the PHY layer, particularly different frequency radios and modulation schemes, dual band systems essentially have to implement both types of systems in one package.

Another extension of the basic 802.11 architecture is the 802.11g proposal (not yet a standard), which is something of a hybrid. It operates in the 2.4 GHz band, like 802.11b, but uses orthogonal frequency division multiplexing OFDM in the PHY layer, like 802.11a, to achieve data rates in excess of 20 Mbps. (802.11g also employs Complementary Code Keying (CCK) like 802.11b for data rates below 20 Mbps. In fact it has a variety of operating modes). Final ratification of the 802.11g protocol is expected in 2003. It is attractive in part because the 2.4 GHz band is largely available world-wide. Some predict that combination 802.11a/g designs will soon supplant 802.11a/b. Indeed, the present invention is applicable to 802.11a/g combination designs (as well as each of them separately).

As noted, both 802.11a and 802.11g protocols employ OFDM encoding. Briefly, OFDM works by dividing one high-speed data carrier into multiple low-speed sub-carriers which are used for transmission of data, in parallel. Put another way, the data stream is divided into multiple parallel bit streams, each transmitted over a different sub-carrier having a lower bit rate. In the case of 802.11a/g there are 52 such sub-carriers, 48 of which are used to carry data. (The other four are pilot sub-carriers, discussed later.) These sub-carriers are orthogonal to each other, so they can be spaced closer together than in conventional frequency-division multiplexing. Mathematically, the integral of the product of any two orthogonal sub-carriers is zero. This property allows separating the sub-carriers at the receiver without interference from other sub-carriers. OFDM systems and circuits are described in greater detail in, for example, U.S. Pat. Nos. 5,345,440; 5,889,759 and 5,608,764 each incorporated herein fully by this reference.

In OFDM systems, carrier frequency offset and noise can produce large degradations of the Bit Error Rate (BER) performance. Indeed they not only produce extra noise due to Inter-Carrier Interference (ICI) but also a parasitic rotation of the symbols which also increases the BER as further discussed later. Carrier frequency offset means any difference in frequency between the carrier frequency generators in the transmitting and receiving circuitry.

U.S. Pat. No. 6,198,782 to De Courville et al. describes methods and apparatus for carrier and clock frequency offset compensation. De Courville obtains a ML estimate jointly for carrier and clock frequency offsets. However, the approach in the 782 patent first removes the channel using equalization for coherent modulation systems (col. 5, line 5). The equalization leads to different noise variance on each subcarrier (i.e. non-white noise). This factor apparently is not considered in the derivation of the ML estimator in the patent (col. 7, line 7).

Several methods are known for estimating and compensating a carrier frequency offset. See for example, U.S. Pat. No. 5,450,456 to Mueller. These techniques are useful, but they do not address sample phase noise or "jitter", in other words discrepancies between the sample rate in a transmitter and a receiver.

SUMMARY OF THE INVENTION

We have discovered improved methods and apparatus to improve performance by compensating channel estimates in an OFDM receiver. The method in one embodiment calls for determining an initial channel estimate responsive to the "training signal" in the preamble of a received packet of OFDM symbols; compensating the initial channel estimate to adjust for carrier frequency offset; and further compensating the initial channel estimate to compensate for sampling phase offset encountered at the receiver A/D converter. Preferably, the compensation to accommodate sampling phase jitter includes determining a specific compensation term for each sub-carrier of the OFDM symbols. More specifically, each sub-carrier specific compensation term increases linearly as a function of the sub-carrier index.

The present invention obtains the ML estimates before equalization such that the additive noise remains white. Furthermore, the ML estimates derived in prior art, such as De Courville, consist of pure phase factors with unit magnitude. The present invention, by contrast, models the distortion by complex factors to allow compensation of the common phase error (due to phase noise) and compensation of the average value of the sampling clock jitter (i.e., the average sampling phase offset for each OFDM symbol).

The compensated channel estimates are given by $$\tilde{H}_k = (A + kB) \hat{H}_k$$

where A and B are complex numbers. This compensation method has a constant term A to account for residual carrier frequency offset and phase noise, and a second term kB that increases linearly with the sub-carrier index to account for sampling phase offsets. Maximum likelihood techniques can be used to estimate the terms A and B.

Compensation in accordance with the invention can be implemented in hardware, software, or a combination of the two. It can be realized in one or more integrated circuits to minimize size and power requirements, with on-board and/or external memory facilities.

Additional aspects and advantages of this invention will be apparent from the following detailed description of particular embodiments thereof, which proceeds with reference to the accompanying drawings.

DETAILED DESCRIPTION OF THE EMBODIMENTS

Figure 1:
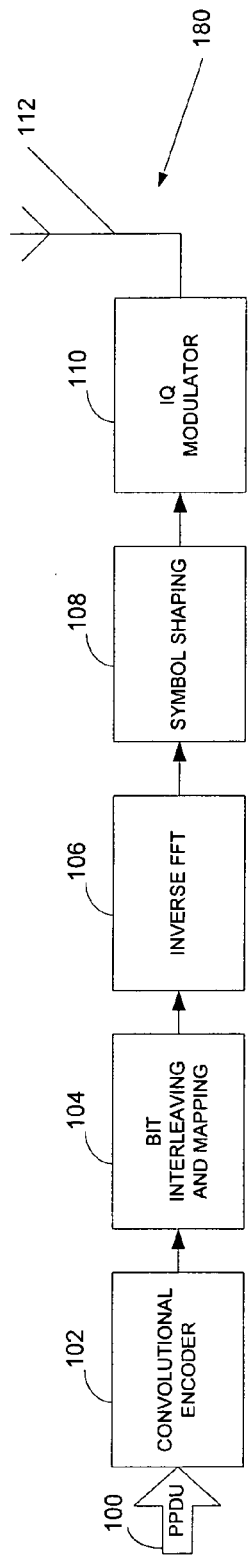
FIG. 1 is a simplified block diagram of an OFDM transmitter PMD

FIG. 1 is a simplified block diagram of an OFDM transmitter PMD compliant with the IEEE 802.11a standard. This illustrates generally a representative environment or application in connection with which the present invention can be used. In FIG. 1, an outbound PPDU, i.e. a data unit, is input at 100. This data unit, described in greater detail below, has a preamble, a header, data portion, tail, pad bits etc. The bit stream is input to a convolutional encoder 102. The information preferably is encoded using convolutional encoding rate R=½, ⅔, or ¾ depending on the specified data rate, and using known polynomials.

Next the encoded data is input to bit interleaving and mapping block 104. Bit interleaving is accomplished by a block interleaver with a block size corresponding to the number of bits in a single OFDM symbol, $N_{CBPS}$, as detailed in the 802.11a standard at 17.3.5.6. The first permutation ensures that adjacent coded bits are mapped onto nonadjacent sub-carriers. The second permutation step ensures that adjacent coded bits are mapped alternately onto less and more significant bits of the constellation and, thereby, long runs of low reliability (LSB) bits are avoided.

Block 104 in FIG. 1 also represents mapping the data, in other words symbol modulation. The encoded and interleaved binary serial input data is divided into groups of bits, each group sized according to the selected modulation (1, 2, 4 or 6 bits). For example, 64-QAM modulation maps 6-bit quantities onto the constellation. The same procedures can be extended to higher rate encoding, e.g. 256-QAM, in which case each group of 8 bits of the serial data is mapped onto one complex number (I+jQ) corresponding to a location on the 256-QAM constellation. The output values are multiplied by a normalization factor, depending on the base modulation mode (for 64-QAM, it is $1/\sqrt{4}$) to achieve the same average power for all mappings.

Each group of 48 complex numbers is associated with one OFDM symbol. Thus 48×6=288 data bits are encoded per OFDM symbol in the case of 64-QAM constellation bit encoding. The symbol duration is 4.0 μsec. Each group of 48 numbers is mapped to a corresponding one of 48 useful sub-carriers, frequency offset index numbers −26 to +26. Accordingly each sub-carrier (except the pilot sub-carriers) will be modulated by one complex number for each OFDM symbol in the current data unit.

In each symbol, four of the sub-carriers are dedicated to pilot signals to assist in coherent detection. They are also used in the accordance with the present invention for compensating the channel estimates to adjust for sample phase jitter. The pilot signals are put in sub-carriers −21, −7, 7 and 21 according to the industry standard. The pilots are BPSK modulated by a pseudo binary sequence to prevent the generation of spectral lines.

The inverse FFT 106 receives all 52 sub-carrier signals and combines them to form a time domain digital signal. Next, a guard interval (not shown) is inserted. The guard interval is to increase immunity to multipath by extending the length of the transmitted symbol. (It is also known as CP or cyclic prefix.) The window length used in the demodulator in the receiver to decode the symbol is that of the active symbol length, in other words excluding the guard interval period. Symbol wave shaping follows, block 108, and then modulation onto I and Q phase quadrature carriers at 110, and finally the combined signal is modulated onto the radio frequency carrier fc for transmission from antenna 112. To summarize mathematically, as noted above, the transmitted time-domain signal (after D/A conversion at rate 1/T) is represented by $$x(t) = \frac{1}{N} \sum_{k=0}^{N-1} X_k e^{j\frac{2\pi kt}{NT}} \qquad (1)$$

where $X_k$ are the frequency-domain data symbols. In other words, the N values $X_k$ represent the respective values of the discretely-varying (e.g. QPSK or QAM) signals modulating the OFDM carriers.

Figure 2:
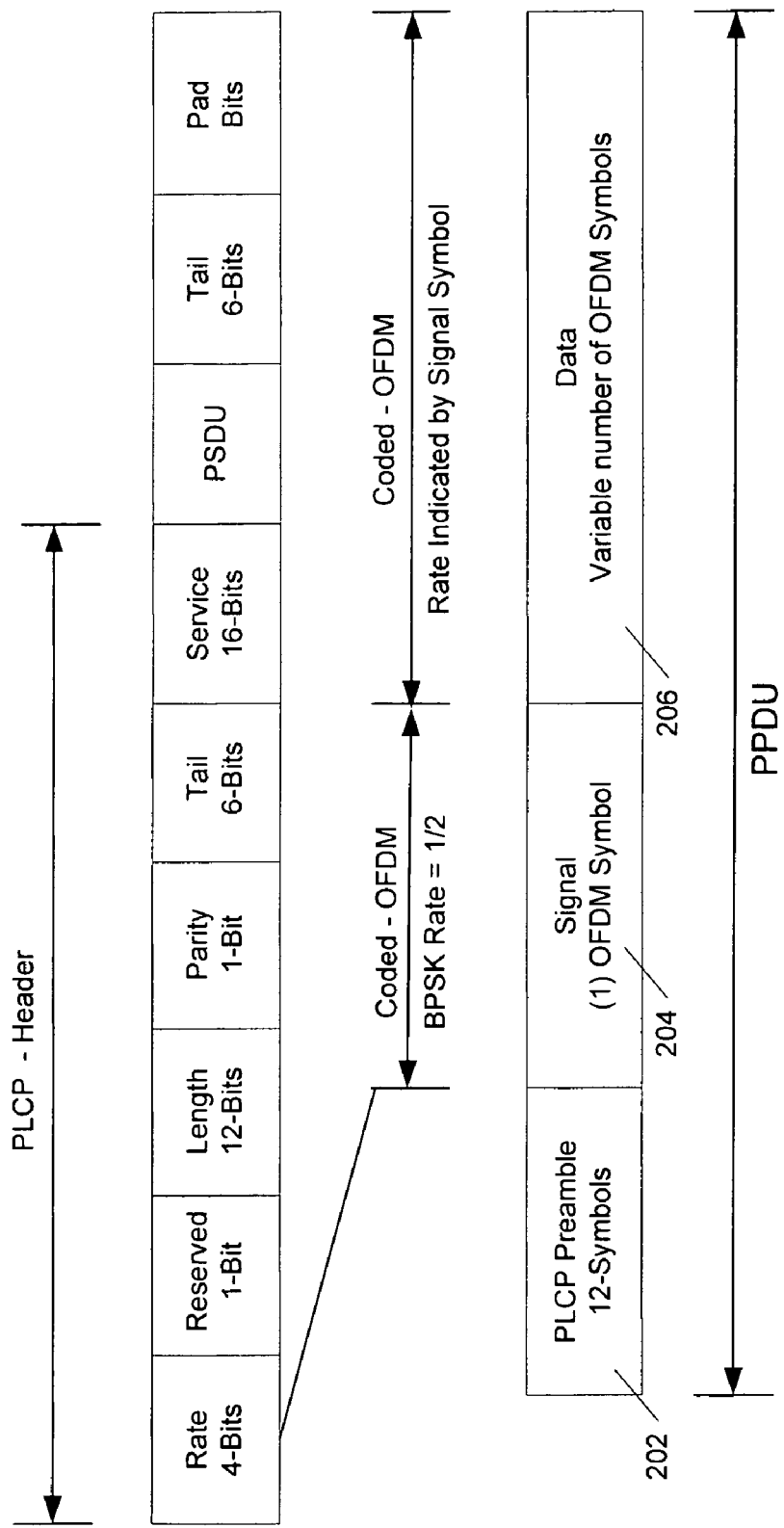
FIG. 2 is a diagram of an OFDM PPDU frame.

Before describing the receiver, we examine more closely the structure of the data unit frame and how it is designed to assist the receiver. FIG. 2 is a block diagram illustrating the structure of a PLCP protocol data unit (PPDU) frame, in accordance with the IEEE 802.11a standard. In particular, this frame structure is a part of the IEEE 802.11a physical layer extension to the basic 802.11 protocol. The 802.11a extension defines requirements for a PHY operating in the 5.0 GHz unlicensed frequency bands and data rates ranging from 6 Mbps to 54 Mbps.

Under this protocol, the PPDU (PLCP protocol data unit) frame consists of a PLCP preamble and signal and data fields as illustrated in FIG. 2. The receiver uses the PLCP preamble to acquire the incoming OFDM signal and synchronize the demodulator. The PLCP header contains information about the PSDU (PLCP service data unit) or payload from the sending OFDM PHY. The PLCP preamble and the signal field are always transmitted at 6 Mbps, binary phase shift keying, modulated using convolutional encoding rate R=½.

The PLCP preamble 202 is used to acquire the incoming signal and train and synchronize the receiver. The PLCP preamble consists of 12 symbols, 10 of which are short symbols, and 2 long symbols. The short symbols are used to train the receiver's AGC and obtain a course estimate of the carrier frequency and the channel. The long symbols are used to fine-tune the frequency and channel estimates. Twelve sub-carriers are used for the short symbols and 53 for the long. The training of an OFDM is accomplished in 16 microseconds. This is calculated as 10 short symbols times 0.8 microseconds each, plus 2 long training symbols at 3.2 microseconds each, plus the guard interval. See IEEE standard 802.11a (1999) Section 17.3.3. These training symbols, as noted above, provide for a channel and frequency offset estimation, but do not compensate for other factors such as sampling frequency jitter.

Referring again to FIG. 2, the preamble field 202 is followed by a signal field 204 which consists of one OFDM symbol. This contains the rate and length fields as requested by the MAC. The rate field conveys information about the type of modulation and the coding rate as used in the rest of the packet. The encoding of the SIGNAL single OFDM symbol is performed with BPSK modulation of the sub-carriers and again using convolutional coding at R=½. The SIGNAL field is composed of 24 bits, with bits 0 to 3 encoding the rate, bit 4 reserved, and bits 5-16 encoding the length of the packet, with the LSB being transmitted first. A single parity bit and 6-bit tail field complete the SIGNAL symbol. Finally, the SIGNAL field 204 is followed by the data 206 comprising a variable number of OFDM symbols including the SERVICE field still forming part of the PLCP Header, consistent with the length specified in the SIGNAL field 204.

Figure 3:
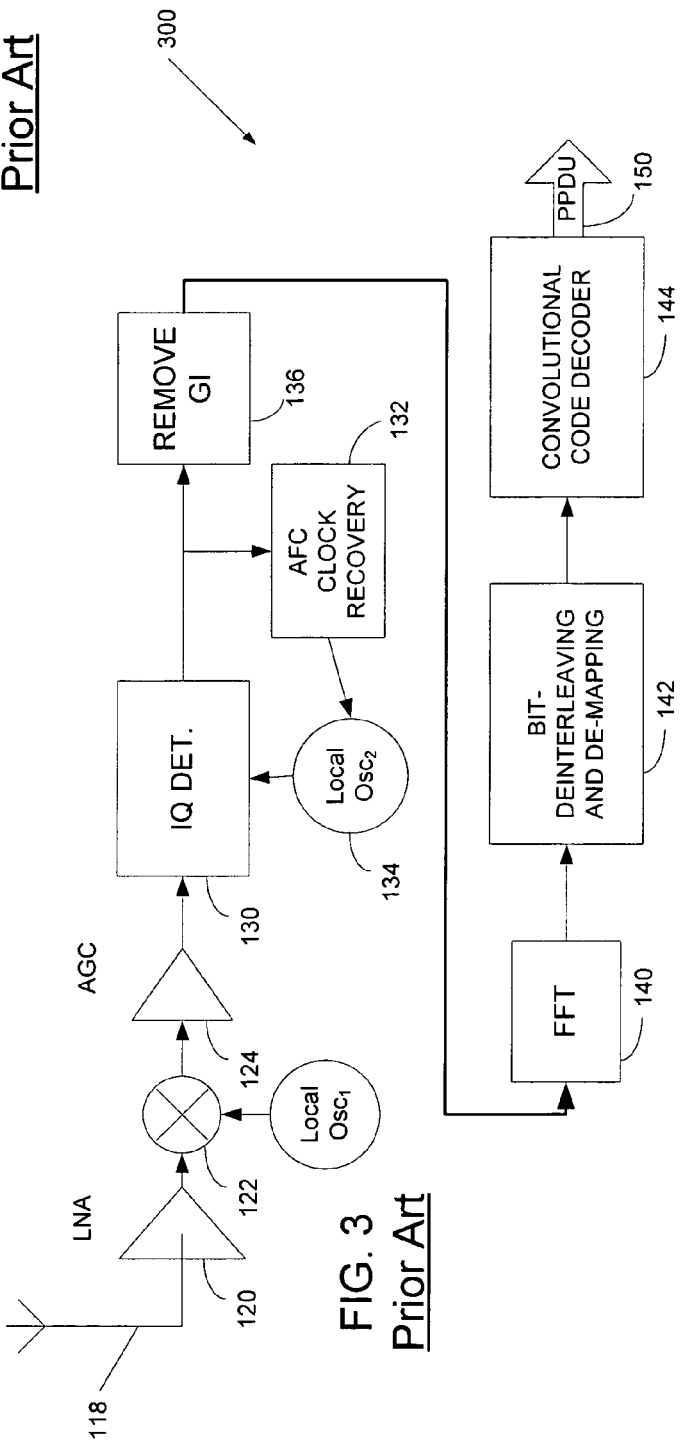
FIG. 3 is a simplified block diagram of an OFDM receiver PMD.

Referring now to FIG. 3, a simplified block diagram of a receiver is shown with the RF receiving antenna 118 at the left. The receiver includes a low-noise amplifier 120, IF detector 122 driver by a local oscillator, and automatic gain control circuit (AGC) 124 as are well known. The resulting signal is input to an IQ detector 130 to recover I and Q phase quadrature analog signals, which are used by AFC clock recover 132 to adjust local oscillator 134 to synchronize with received signals. The recovered signals are converted to digital data by A/D sampling (not shown), guard interval removed 136, and the stream of data is converted to parallel form for input to FFT 140.

The FFT (implementation of the Discrete Fourier Transform) demodulates the data from the sub-carrier signals to recover the 52 signals which in turn are serialized and then input to block 142 for bit de-interleaving and de-mapping (from the constellation) back into a serial binary stream, which then undergoes convolutional decoding 144 to recover the inbound data unit PPDU 150 transmitted by an incident OFDM transmitter arranged in accordance with the transmitter 180 shown in FIG. 1. Further details of this type of receiver are known, but the need remains for improvements in performance especially at higher data rates, i.e. above 54 Mbps which is not currently considered by the IEEE 802.11a (1999) and 802.11g (2002 draft) standards.

The OFDM system can be modeled as follows. The transmitted time-domain signal (after D/A conversion at rate 1/T) is represented by e.g. n(1) discussed above, where $X_k$ are the frequency-domain data symbols. In other words, the N values $X_k$ represent the respective values of the discretely-varying (e.g. QPSK or QAM) signals modulating the OFDM carriers.

Multipath is a performance concern that also must be taken into account. Multipath occurs when the direct path of the transmitted signal is combined with reflected signal paths, resulting in a corrupted signal at the receiver. The delay of the reflected signals, a function of the propagation environment, typically around 50-300 nanoseconds, is commonly known as delay spread. We model the transmitted signal as distorted by a multipath channel with impulse response h(t). Moreover, at the receiver, residual frequency offset and phase noise contribute to a multiplicative distortion $e^{j\Phi(t)}$. Finally, white Gaussian noise v(t) is added to form the received signal y(t).

$$y(t) = e^{j\Phi(t)}[h(t)*x(t)] + v(t) \quad (2)$$

The received signal is sampled at the A/D converter (at rate 1/T) with some jitter (represented by sn) on the sampling phase. Thus, the A/D output can be written as $$y_n = y([n+s_n]T) \quad (3)$$

$$= e^{j\phi_n} \int h(\tau) x([n+s_n]T - \tau) d\tau + v_n$$

where $N_n = ([n+s_n]T)$ and $v_n = v([n+s_n]T)$. After simplification, we have $$y_n = e^{j\phi_n} \cdot \frac{1}{N} \sum_{l=0}^{N-1} H_l X_l e^{j\frac{2\pi l(n+s_n)}{N}} + v_n \text{ where} \quad (4)$$

$$H_l = \int h(\tau) e^{-j\frac{2\pi l \tau}{NT}} d\tau.$$

For data detection, the DFT (Discrete Fourier Transform) of $Y_k$ is computed and is given by $$Y_k = \sum_{n=0}^{N-1} y_n e^{-j2\pi kn/N} \quad (5)$$

$$= \frac{1}{N} \sum_{l=0}^{N-1} H_l X_l \sum_{n=0}^{N-1} e^{j2\pi n(l-k)/N} e^{j(\phi_n + 2\pi/s_n/N)} + V_k$$

$$= \frac{1}{N} H_k X_k \sum_{n=0}^{N-1} e^{j(\phi_n + 2\pi k s_n/N)} + W_k$$

where $V_k$ is the DFT of $v_n$ and $W_k$ represents the intercarrier interference (ICI) and AWGN. If $|\phi_n + 2\pi k s_n/N| \ll 1$, $$Y_k \approx H_k X_k \left[ 1 + \frac{j}{N} \sum_{n=0}^{N-1} \phi_n + j\frac{2\pi k}{N} \cdot \frac{1}{N} \sum_{n=0}^{N-1} s_n \right] + W_k. \quad (6)$$

This equation (6) suggests that the channel estimates $\hat{H}_k$ can be compensated by multiplying the channel estimates by an estimate of the factor given in square brackets above. However, we have discovered that improved performance, especially at high data rates, can be achieved by using the following "affine" compensation factor. Here, "affine" means "linear plus constant". The compensating factor consists of a term that is linear with sub-carrier index (kB) plus a constant (A). The compensated channel estimates thus are given by $$\tilde{H}_k = (A + kB)\hat{H}_k \quad (7)$$

where A and B are complex numbers. This compensation method has a constant term A to account for residual carrier frequency offset and phase noise, and a second term kB that increases linearly with the sub-carrier index to account for sampling phase offsets. The "average" value of the jitter over one OFDM symbol results in the "sampling phase offset" for which we compensate. The next section describes maximum likelihood estimates for A and B.

Maximum Likelihood Compensation of Channel Estimates

From the pilot tones, $X_k$, $k \in K$(cursive), the maximum likelihood estimates for A and B have been derived; the results are $$A_{ML} = \frac{m_{22} r_1 - m_{12} r_2}{m_{11} m_{22} - m_{12}^2} \quad (8)$$

$$B_{ML} = \frac{-m_{12} r_1 + m_{11} r_2}{m_{11} m_{22} - m_{12}^2} \text{ where} \quad (9)$$

$$m_{11} = \sum_{k \in K} |\hat{H}_k X_k|^2 \quad (10)$$

$$m_{12} = \sum_{k \in K} k |\hat{H}_k X_k|^2 \quad (11)$$

$$m_{22} = \sum_{k \in K} k^2 |\hat{H}_k X_k|^2 \quad (12)$$

$$r_1 = \sum_{k \in K} Y_k \hat{H}_k^* X_k^* \quad (13)$$

$$r_2 = \sum_{k \in K} k Y_k \hat{H}_k^* X_k^*. \quad (14)$$

The channel estimates are then compensated according to (7) before further processing.

Figure 4:
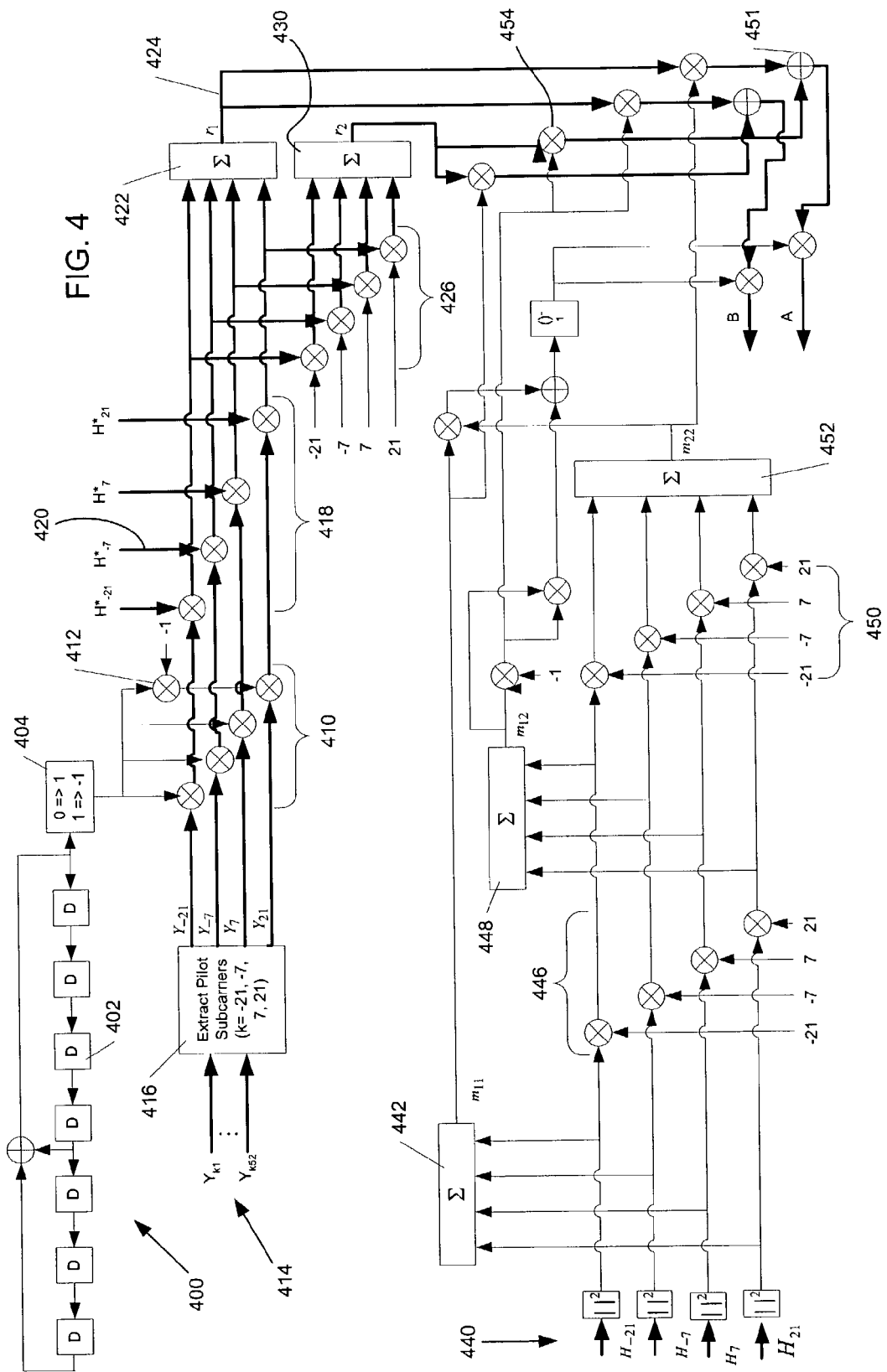
FIG. 4 Calculation flow diagram for improved compensation for common phase error and sampling phase drift.

FIG. 4 is a block diagram illustrating calculation of the compensation for updating channel estimates to compensate for carrier phase error and sampling phase offset in accordance with the present invention. In FIG. 4 (upper left) a shift register 400 is formed of a series of delay of individual delay elements, for example, 402 so as form and coder/decoder arranged to remove the known modulation of the pilot carriers. Each delay element 402 delays the signal by one OFDM symbol. The shift register is initialized to a state of all ones starting from the SIGNAL symbol (see FIG. 2). (The term "shift register" is used here to describe the functional arrangement of these elements. While a discrete "shift register" chip or circuit element could be used, a more practical and preferred embodiment would be to implement the corresponding functionality in the receiver DSP software.) Element 404 translates zeros into ones and ones into minus ones and the resulting signals are input to a series of four multiplier circuits 410 except that one of the signals is multiplied by minus one in multiplier 412.

The receiver FFT outputs, namely, the 52 sub-carrier signals $Y_{k1}$ to or through $Y_{k52}$ are input at 414 to element 416 which simply extracts the four pilot sub-carriers (k=−21, −7, 7, 21). These four signals are input to the series of multipliers 410 as illustrated. The products produced by 410 are the pilot tones with the known BPSK modulation removed (i.e. the multiplications are actually sign changes depending on the shift register output). Next, each of these signals is input to a corresponding multiplier, collectively labeled 418 and multiplied by the complex conjugate of the corresponding channel estimate, for example, $H^*_{-7}$ indicated at 420. The details of implementing multipliers, including complex multipliers, are well known. Finally, the resulting four products are summed in summation circuit 422 to form the signal $r_1$ at node 424.

To summarize, these elements illustrate an implementation of formula 13 above, i.e., the summation over the pilot signals of the corresponding data symbols times the complex conjugate of the corresponding channel estimates times the complex conjugates of the pilot tones. Element 404 converts the shift register output from bits (0 or 1) to +−1 to change the sign of the pilot sub-carrier signals. The pilot sub-carrier index numbers, fixed scalar quantities, are input to a series of multipliers 426 in which each of them is multiplied by the corresponding products of multipliers 418. The outputs (products) of multipliers 426 are summed in element 430 to form the quantity $r_2$ in accordance with the equation 14 above.

The channel estimates $H_{-21}$ $H_{-7}$ $H_7$ and $H_{21}$ are input to a series of elements 440 each of which produces a quantity equal to the square of the magnitude of the corresponding input signal. Each channel estimate is, of course, a complex number, indicating the channel frequency and nominal phase. These quantities are summed in element 442 to provide $m_{11}$ in accordance with equation 10 above. The $|H^*X_k|^2$ are each multiplied by the corresponding sub-carrier index in multipliers 446, respectively, and then summed in element 448 to form the quantity $m_{12}$, as reflected in equation 11 above. The outputs (products) of multipliers 446 are again multiplied by the corresponding sub-carrier indexes in multipliers 450, and the resulting products are summed in element 452 so as to form the quantity $m_{22}$ in accordance with equation 12 above.

The remaining multipliers and adders correspond to the computations reflected in equations 8 and 9 above. For example, $r_2$ is multiplied by minus one times $m_{12}$ and a multiplier 454, and the result is summed together with $m_{22}$ times $r_1$ at element 456 to form the numerator portion of equation 8 that determines the value of A in the A term in the channel compensation factor. The remaining elements of FIG. 4 will be apparent to the reader in view of this description taken together with equations 8 and 9 above. It should be understood that FIG. 4 merely illustrates certain calculations; it is not a hardware schematic. The illustrated calculations can be implemented in hardware, e.g. a DSP or microprocessor core, with appropriate software, or dedicated custom hardware could be used, in whole or in part. Various arrangements can be devised by those of ordinary skill in view of the present disclosure without departing from the scope of the present invention.

Simulation Results

Figure 5:
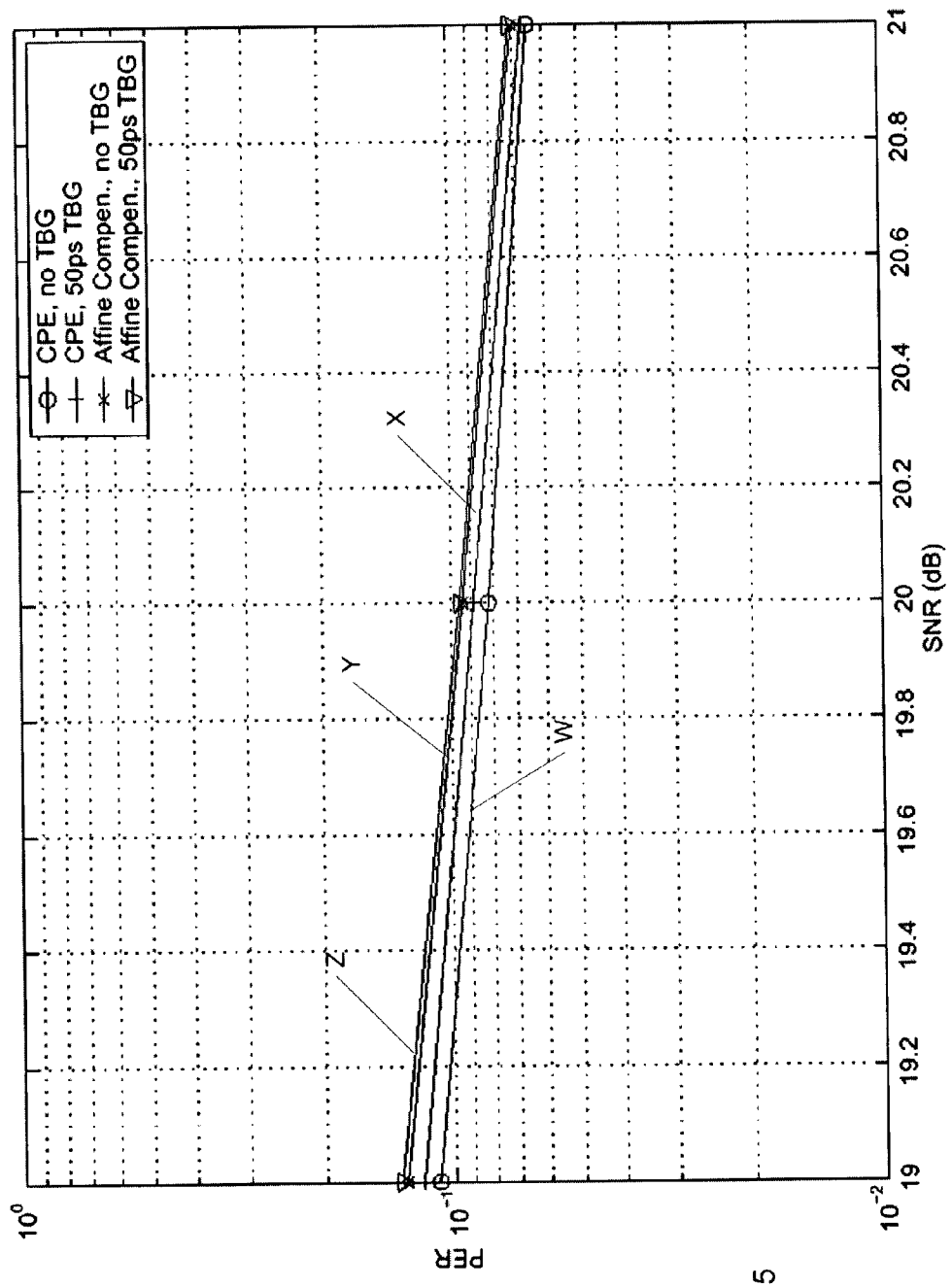
FIG. 5 is a plot of simulation results at 24 Mbps.

In this section, results of simulations for an IEEE 802.11a and 802.11g compliant receiver are presented to illustrate the performance of this compensation technique. FIG. 5 is a plot of the packet-error rate (PER) versus signal-to-noise ratio (SNR) for the 24 Mbps mode and 50-ns rms delay spread multipath channels. The frequency offset is $\Delta f=210$ kHz. The rms phase noise is set to 3° with a 3-dB frequency of 20 kHz. The in-phase/quadrature imbalance is set to 1° and 1% gain imbalance. The channel estimates are also adapted using slicer decisions and a single pole filter with adaptation parameter $\alpha CH=\frac{1}{16}$.

In all the simulations, nonlinearity from the power amplifier is not included. The CPE curves labeled W and X in FIGS. 5-8 constitute the simulation results when the channel estimates are compensated using only the constant term, i.e.

$$\tilde{H}_k = A\hat{H}_k$$

The "no TBG" curves (labeled W and Y in FIGS. 5-8) show the simulation results when no sampling jitter was present; the "50 ps TBG" curves (labeled X and Z) in FIGS. 5-8 denote that the time-based generator contributes a sampling jitter with rms value of 50 ps, i.e., $sn=\Sigma_{m=0}^{n}\epsilon_m$, where $\epsilon_m$ are i.i.d. zero-mean Gaussian random variables with $\sigma_\epsilon T=50$ ps ($\sigma_\epsilon$ is the standard deviation of $\epsilon_m$ and T is the D/A sampling period).

The results shown in FIG. 5 indicate that the loss due to TBG jitter is small and that the "CPE" method (shown by curves W and X) has a gain of around 0.3 dB at 10% PER compared to the "affine" compensation method (curves Y and Z in the figure). This small gain is due to the estimation of two parameters (A and B) in the "affine" method using the 4 noisy pilot tones, while the "CPE" method needs to estimate only one parameter (A).

Figure 6:
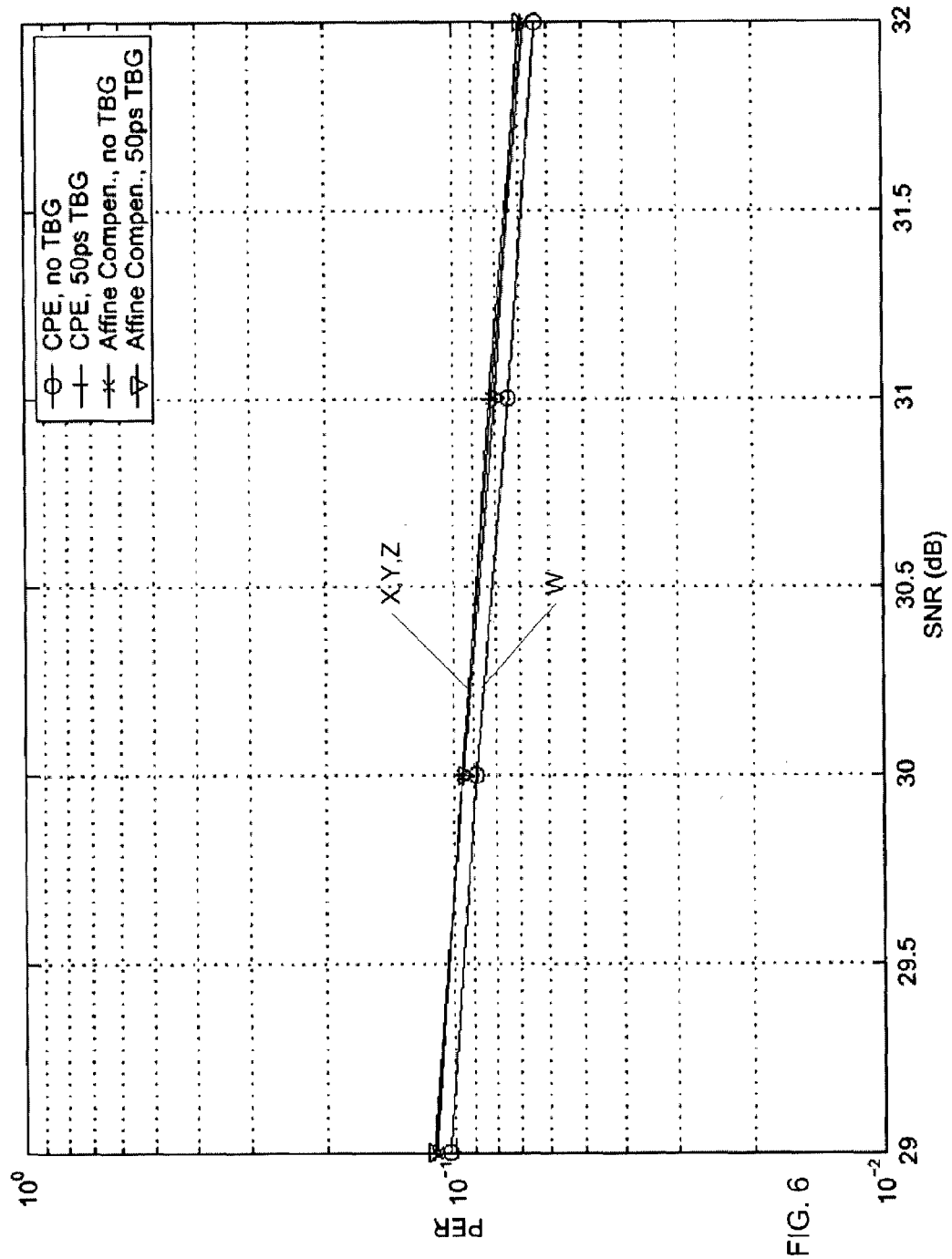
FIG. 6 is a plot of simulation results at 54 Mbps.

FIG. 6 plots simulation results at 54 Mbps mode and 25-ns rms delay spread. Here, the performance for "CPE" and "affine" methods are nearly identical in the presence of the TBG jitter (curves X and Z respectively). In other words, little performance benefit is realized under these conditions.

Figure 7:
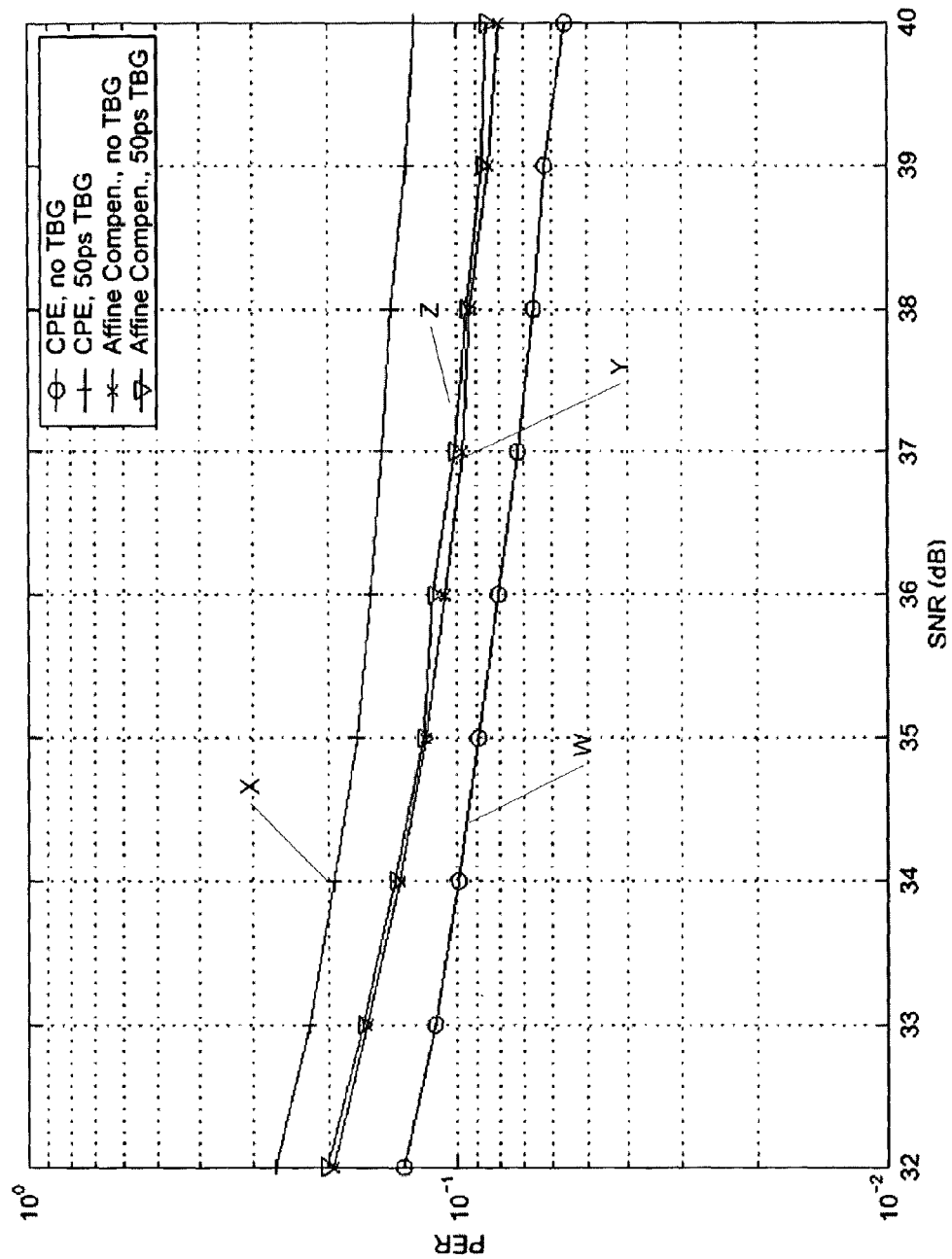
FIG. 7 is a plot of simulation results at 72 Mbps.

FIG. 7 plots simulation results for the 72 Mbps mode using 256 QAM and a rate 3/4 convolutional code. From the plot, there is a loss of around 2.7 dB at 10% PER using the "affine" compensation method (curve Y) compared to the "CPE" method (curve W) when no jitter is present. As mentioned earlier, this loss is caused by estimated two parameters (A and B) using the 4 pilot tones, when in fact one parameter (A) is sufficient when no jitter is present. However, when TBG jitter is included, the "affine" compensation method (curve Z) performs significantly better than the "CPE" method (curve X).

Figure 8:
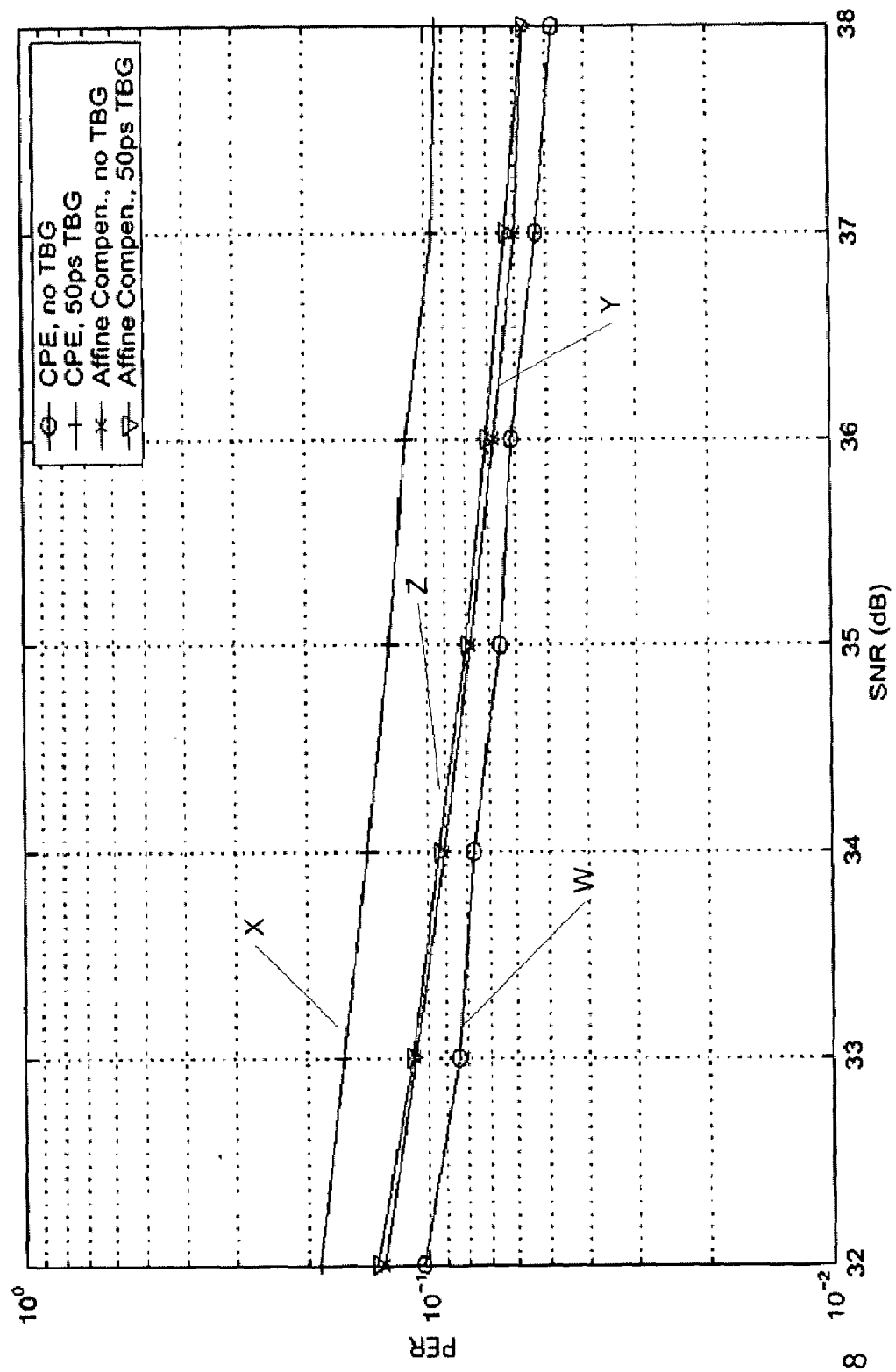
FIG. 8 is a plot of simulation results at 72 Mbps with 2 degrees rms phase noise.

Referring now to FIG. 8, for the 72 Mbps mode with rms phase noise of 2° and a 3-dB frequency of 20 kHz, the loss of the "affine" compensation method (curve Y) with respect to the "CPE" method (curve W) is around 1.2 dB at 10% PER when no jitter is present. However, when TBG jitter is present, the "affine" method (curve Z) has a gain of around 3.1 dB at 10% PER compared to the "CPE" method (curve X). Thus the present invention is particularly advantageous at 72 Mbps, and in general appears to be useful at data rates over 54 Mbps.

Implementation of a receiver that embodies the invention requires additional circuitry (consistent with the flow diagram illustrated in FIG. 4) as compared to a conventional receiver design, with an attendant increase in power consumption. However, since the invention is most useful at higher data rates, e.g. over 54 Mbps, it could be implemented with an enable or switching circuit so that the extra circuitry to implement the above compensation of channel estimates could be turned on only when needed, thereby saving power consumption during operation at lower data rates.

Figure 9:
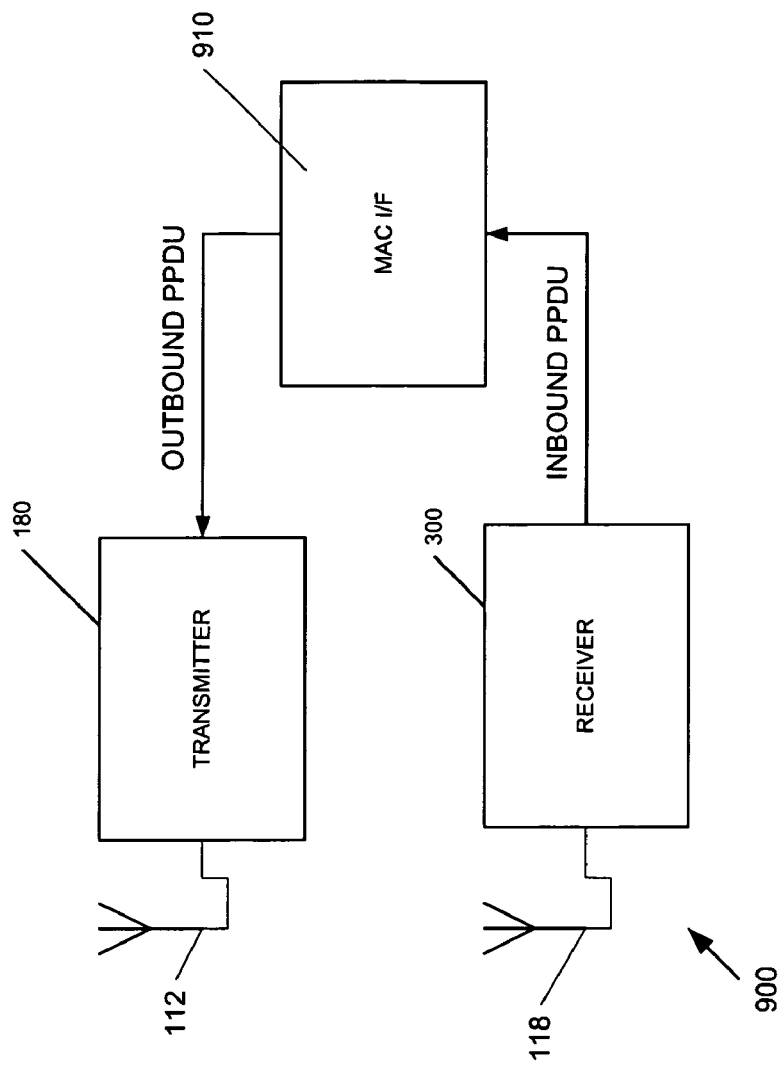
FIG. 9 is a simplified block diagram of a transceiver incorporating the transmitter of FIG. 1 and the receiver of FIG. 3.

Turning briefly to FIG. 9, FIG. 9 shows a transceiver 900 capable of implementing the teachings of the present invention, and includes receiver 300 described above with reference to FIG. 3 and a transmitter 180 described above with reference to FIG. 1 communicatively coupled to a network interface such as a MAC interface 910. As such, inbound PPDU (e.g. PPDU 150 in FIG. 3) recovered by the receiver 300 is conveyed to the MAC I/F 910, and outbound PPDU (e.g. PPDU 100 in FIG. 1) is relayed by the MAC I/F 910 to the transmitter 180 for transmission over a wireless medium such as air via the antenna 112. Though not shown in FIG. 9, the transceiver 900 may form an operational part of a network interface apparatus such as a PC card or network interface card capable of interfacing with the CPU or information processor of an information processing apparatus such as a desktop or laptop computer, and may be integrated within and constitute a part of such information processing apparatus. This network interface apparatus may alternatively form an operational component of a wireless communications access point such as a base station as will be appreciated by these ordinarily skilled in the art.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method of compensating channel estimates in an OFDM receiver comprising the steps of:
   determining an initial channel estimate responsive to a series of training symbols in a preamble of a received packet comprising a series of OFDM symbols;
   compensating phase of the initial channel estimate to adjust for carrier frequency offset;
   further compensating the initial channel estimate to compensate for sampling phase jitter at a receiver A/D converter;
   determining whether the received packet effects a data rate greater than 54 Mbps; and
   executing said further compensating step only when the received OFDM symbols have a data rate greater than 54 Mbps,
   wherein compensating the phase includes estimating a first affine complex number having a nonzero imaginary component directed to the carrier frequency offset and the sampling phase jitter.

2. The method of claim 1, wherein said compensating the initial channel estimate to compensate for sampling phase jitter includes determining a specific compensation term for each sub-carrier of the OFDM symbols.

3. The method of claim 2, wherein each sub-carrier specific compensation term increases as a function of a sub-carrier index.

4. The method of claim 2, wherein each sub-carrier specific compensation term increases linearly with a sub-carrier index.

5. A method of compensating channel estimates in an OFDM receiver comprising the steps of:
   determining an initial channel estimate responsive to a series of training symbols in a preamble of a received packet comprising a series of OFDM symbols;
   compensating phase of the initial channel estimate to adjust for carrier frequency offset; and
   further compensating the initial channel estimate to compensate for sampling phase jitter at a receiver A/D converter,
   wherein the compensated channel estimates are equal to (A+kB) times the initial channel estimate, where A and B are complex numbers each having a nonzero imaginary component and k is the corresponding sub-carrier index, such that A is directed to carrier frequency offset and phase noise while kB increases linearly with sub-carrier index to compensate for sampling phase offsets.

6. The method of claim 5, wherein both A and B are estimated using maximum likelihood estimation techniques responsive to pilot signals modulating predetermined sub-carriers.

7. The method of claim 5, wherein pilot signal sub-carrier indexes are −21, −7, 7 and 21 in accordance with at least one of IEEE standard 802.11a and proposed standard 802.11g draft D2.8, May 2002.

8. The method of claim 7, wherein the received packet comprises at least one of an 802.11a compliant packet effecting a data rate of at least 50 Mbps.

9. The method of claim 7, wherein the received packet comprises an 802.11a compliant packet in which data is modulated using a QAM constellation of at least 64 symbols.

10. A method of compensating channel estimates prior to demodulation in an OFDM receiver to compensate for carrier frequency offset, carrier phase jitter and sampling offset comprising the steps of:
    determining initial channel estimates $\hat{H}_k$ responsive to a series of training symbols in a preamble of a received packet comprising a series of OFDM symbols; and
    compensating phase of the initial channel estimates according to the equation $$\tilde{H}_k = (A+kB)\hat{H}_k$$

for $-26 \leq k \leq 26$;
    wherein each of A and B is a complex number having a nonzero imaginary component, thereby determining a specific affine compensation term for each sub-carrier of the OFDM symbols.

11. The method of claim 10 wherein the received packet of OFDM symbols is compliant with at least one of IEEE standard 802.11a and proposed standard 802.11g draft D2.8, May 2002.

12. The method of claim 10 further comprising determining whether the received packet effects a data rate greater than 54 Mbps; and compensating the initial estimates only when the received OFDM symbols have a data rate greater than 54 Mbps.

13. A method of compensating channel estimates prior to demodulation in an OFDM receiver to compensate for carrier frequency offset, carrier phase jitter and sampling offset comprising the steps of:
    determining initial channel estimates $\hat{H}_k$ responsive to a series of training symbols in a preamble of a received packet comprising a series of OFDM symbols;
    compensating the initial channel estimates according to the equation $$\tilde{H}_k = (A+kB)\hat{H}_k$$

for $-26 \leq k \leq 26$, wherein each of A and B is a complex number, thereby determining a specific affine compensation term for each sub-carrier of the OFDM symbols; and
    using maximum likelihood estimates for A and B where the estimates for A and B are determined as $$A = A_{ML} = \frac{m_{22}r_1 - m_{12}r_2}{m_{11}m_{22} - m_{12}^2}$$

$$B = B_{ML} = \frac{-m_{12}r_1 + m_{11}r_2}{m_{11}m_{22} - m_{12}^2} \text{ where}$$

$$m_{11} = \sum_{k \in K} |\hat{H}_k X_k|^2$$

$$m_{12} = \sum_{k \in K} k |\hat{H}_k X_k|^2$$

$$m_{22} = \sum_{k \in K} k^2 |\hat{H}_k X_k|^2$$

$$r_1 = \sum_{k \in K} Y_k \hat{H}_k^* X_k^*$$

$$r_2 = \sum_{k \in K} k Y_k \hat{H}_k^* X_k^*$$

and where $X_k$ represents frequency domain data symbols and $Y_k$ represents sub-carrier symbols.

14. The method of claim 13, including obtaining said maximum likelihood estimates prior to equalization of the received signals.

15. An OFDM receiver, comprising:
    a channel estimator to form a plurality of initial channel estimates in response to received training symbols for use in removing the effects of each channel in the recovery of transmitted data; and
    a channel compensator responsive to said channel estimator to compensate the phase of at least one of the initial channel estimates, the channel compensator to provide a corresponding compensation term for each said initial channel estimate to compensate the initial channel estimate responsive to sampling clock jitter as well as common phase error;
    wherein each compensation term consists of a sum of a constant element and a variable element, the variable element responsive to a corresponding channel sub-carrier index, and
    wherein at least one of the channel estimate compensation terms includes of a sum of a first complex number A defining the constant term, plus the product of a second complex number B multiplied by the corresponding channel sub-carrier index, a scalar, said product defining the variable term, and each of A and B has a nonzero imaginary component.

16. The receiver of claim 15, wherein the variable element of each compensation term varies linearly with the corresponding sub-carrier index.

17. The receiver of claim 15, wherein the initial channel estimates are formed responsive to signals modulated onto a plurality of pilot sub-carriers.

18. The receiver of claim 15, wherein the receiver complies with at least one of IEEE standard 802.11a and proposed standard 802.11g draft D2.8, May 2002.

19. The receiver of claim 15, wherein the complex numbers A and B are determined using a maximum likelihood technique.

20. An OFDM receiver, comprising:
a channel estimator to form a plurality of initial channel estimates in response to received training symbols for use in removing the effects of each channel in the recovery of transmitted data; and
a channel compensator responsive to said channel estimator to compensate at least one of the initial channel estimates, the channel compensator to provide a corresponding compensation term for each said initial channel estimate to compensate the initial channel estimate responsive to sampling clock jitter as well as common phase error;
wherein each compensation term consists of a sum of a constant element and a variable element, the variable element responsive to a corresponding channel sub-carrier index, at least one of the channel estimate compensation terms consists of a sum of a first complex number A defining the constant term, plus the product of a second complex number B multiplied by the corresponding channel sub-carrier index, a scalar, said product defining the variable term, and the complex numbers A and B are determined using a maximum likelihood technique, where the estimates for A and B are determined as $$A = A_{ML} = \frac{m_{22}r_1 - m_{12}r_2}{m_{11}m_{22} - m_{12}^2}$$

$$B = B_{ML} = \frac{-m_{12}r_1 + m_{11}r_2}{m_{11}m_{22} - m_{12}^2} \text{ where}$$

$$m_{11} = \sum_{k \in K} |\hat{H}_k X_k|^2$$

$$m_{12} = \sum_{k \in K} k |\hat{H}_k X_k|^2$$

$$m_{22} = \sum_{k \in K} k^2 |\hat{H}_k X_k|^2$$

$$r_1 = \sum_{k \in K} Y_k \hat{H}_k^* X_k^*$$

$$r_2 = \sum_{k \in K} k Y_k \hat{H}_k^* X_k^*$$

and where $X_k$ represents frequency domain data symbols and $Y_k$ represents sub-carrier symbols.

21. An OFDM receiver, comprising:
a channel estimator to form a plurality of initial channel estimates in response to received training symbols for use in removing the effects of each channel in the recovery of transmitted data; and
a channel compensator responsive to said channel estimator to compensate at least one of the initial channel estimates, the channel compensator to provide a corresponding compensation term for each said initial channel estimate to compensate the initial channel estimate responsive to sampling clock jitter as well as common phase error;
wherein each compensation term consists of a sum of a constant element and a variable element, the variable element responsive to a corresponding channel sub-carrier index and the channel compensator is active only when received signals have a data rate greater than 54 Mbps, thereby reducing power consumption when receiving at lower data rates.

22. An OFDM receiver, comprising:
means for forming a plurality of initial channel estimates in response to received training symbols for use in removing the effects of each channel in the recovery of transmitted data; and
means for compensating phase of at least one of the initial channel estimates, said compensating means including means for providing a corresponding compensation term for each said initial channel estimate to compensate the initial channel estimate responsive to sampling clock jitter as well as common phase error;
wherein each compensation term consists of a sum of a constant element and a variable element, the variable element responsive to a corresponding channel sub-carrier index, and
wherein at least one of the channel estimate compensation terms includes a sum of a first complex number A defining the constant term, plus the product of a second complex number B multiplied by the corresponding channel sub-carrier index, a scalar, said product defining the variable term, and each of A and B has a nonzero imaginary component.

23. The receiver of claim 22, wherein the variable element of each compensation term varies linearly with the corresponding sub-carrier index.

24. The receiver of claim 22, wherein the initial channel estimates are formed responsive to signals modulated onto a plurality of pilot sub-carriers.

25. The receiver of claim 22, wherein the receiver complies with at least one of IEEE standard 802.11a and proposed standard 802.11g draft D2.8, May 2002.

26. The receiver of claim 22, wherein the complex numbers A and B are determined using a maximum likelihood technique.

27. An OFDM receiver, comprising:
means for forming a plurality of initial channel estimates in response to received training symbols for use in removing the effects of each channel in the recovery of transmitted data; and
means for compensating at least one of the initial channel estimates, said compensating means including means for providing a corresponding compensation term for each said initial channel estimate to compensate the initial channel estimate responsive to sampling clock jitter as well as common phase error;
wherein each compensation term consists of a sum of a constant element and a variable element, the variable element responsive to a corresponding channel sub-carrier index, at least one of the channel estimate compensation terms consists of a sum of a first complex number A defining the constant term, plus the product of a second complex number B multiplied by the corresponding channel sub-carrier index, a scalar, said product defining the variable term, and the complex numbers A and B are determined using a maximum likelihood technique, where the estimates for A and B are determined as $$A = A_{ML} = \frac{m_{22}r_1 - m_{12}r_2}{m_{11}m_{22} - m_{12}^2}$$

$$B = B_{ML} = \frac{-m_{12}r_1 + m_{11}r_2}{m_{11}m_{22} - m_{12}^2} \text{ where}$$

$$m_{11} = \sum_{k \in K} |\hat{H}_k X_k|^2$$

$$m_{12} = \sum_{k \in K} k |\hat{H}_k X_k|^2$$

$$m_{22} = \sum_{k \in K} k^2 |\hat{H}_k X_k|^2$$

$$r_1 = \sum_{k \in K} Y_k \hat{H}_k^* X_k^*$$

$$r_2 = \sum_{k \in K} k Y_k \hat{H}_k^* X_k^*$$

and where $X_k$ represents frequency domain data symbols and $Y_k$ represents sub-carrier symbols.

28. An OFDM receiver, comprising:

means for forming a plurality of initial channel estimates in response to received training symbols for use in removing the effects of each channel in the recovery of transmitted data; and means for compensating at least one of the initial channel estimates, said compensating means including means for providing a corresponding compensation term for each said initial channel estimate to compensate the initial channel estimate responsive to sampling clock jitter as well as common phase error;

wherein each compensation term consists of a sum of a constant element and a variable element, the variable element responsive to a corresponding channel sub-carrier index and said compensating means is active only when received signals have a data rate greater than 54 Mbps, thereby reducing power consumption when receiving at lower data rates.

29. A wireless transceiver, comprising:

a transmitter; and a receiver capable of receiving signals that employ an orthogonal frequency domain modulation scheme and include training symbols, the receiver comprising:

a channel estimator to form a plurality of initial channel estimates in response to received training symbols for use in removing the effects of each channel in the recovery of transmitted data; and a channel compensator responsive to said channel estimator to compensate phase of at least one of the initial channel estimates, said channel compensator to provide a corresponding compensation term for each of said initial channel estimates to compensate the initial channel estimates for sampling clock jitter as well as common phase error, wherein each compensation term includes of the sum of a constant element and a variable element, the variable element responsive to a corresponding channel sub-carrier index, and wherein at least one of the channel estimate compensation terms consists of the sum of a first complex number A defining the constant element, plus the product of a second complex number B multiplied by the corresponding channel sub-carrier index, a scalar, said product defining the variable element and each of A and B has a nonzero imaginary component.

30. The transceiver of claim 29, wherein the variable element of each compensation term varies linearly with the corresponding channel sub-carrier index.

31. The transceiver of claim 29, wherein both the transmitter and the receiver comply with at least one of IEEE standard 802.11a and proposed standard 802.11g draft D2.8, May 2002.

32. The transceiver of claim 29, wherein the complex numbers A and B are determined using a maximum likelihood technique.

33. A wireless transceiver, comprising:

a transmitter; and a receiver capable of receiving signals that employ an orthogonal frequency domain modulation scheme and include training symbols, the receiver comprising:

a channel estimator to form a plurality of initial channel estimates in response to received training symbols for use in removing the effects of each channel in the recovery of transmitted data; and a channel compensator responsive to said channel estimator to compensate at least one of the initial channel estimates, said channel compensator to provide a corresponding compensation term for each of said initial channel estimates to compensate the initial channel estimates for sampling clock jitter as well as common phase error, wherein the channel compensator is active only when the received signals have a data rate greater than 54 Mbps, thereby reducing power consumption when receiving at lower data rates.

34. A wireless transceiver, comprising:

means for transmitting; and means for receiving signals that employ an orthogonal frequency domain modulation scheme and include training symbols, comprising:

means for forming a plurality of initial channel estimates in response to received training symbols for use in removing the effects of each channel in the recovery of transmitted data; and means for compensating phase of at least one of the initial channel estimates, said compensating means including means for providing a corresponding compensation term for each of said initial channel estimates to compensate the initial channel estimates for sampling clock jitter as well as common phase errors, wherein each compensation term consists of the sum of a constant element and a variable element, the variable element responsive to a corresponding channel sub-carrier index, and wherein at least one of the channel estimate compensation terms includes of the sum of a first complex number A defining the constant element, plus the product of a second complex number B multiplied by the corresponding channel sub-carrier index, a scalar, said product defining the variable element and each of A and B has a nonzero imaginary component.

35. The transceiver of claim 34, wherein the variable element of each compensation term varies linearly with the corresponding channel sub-carrier index.

36. The transceiver of claim 34, wherein both the transmitter and the receiver comply with at least one of IEEE standard 802.11a and proposed standard 802.11g draft D2.8, May 2002.

37. The transceiver of claim 34, wherein the complex numbers A and B are determined using a maximum likelihood technique.

38. A wireless transceiver, comprising:
means for transmitting; and
means for receiving signals that employ an orthogonal frequency domain modulation scheme and include training symbols, comprising:
means for forming a plurality of initial channel estimates in response to received training symbols for use in removing the effects of each channel in the recovery of transmitted data; and
means for compensating at least one of the initial channel estimates, said compensating means including means for providing a corresponding compensation term for each of said initial channel estimates to compensate the initial channel estimates for sampling clock jitter as well as common phase error,
wherein said compensating means is active only when the received signals have a data rate greater than 54 Mbps, thereby reducing power consumption when receiving at lower data rates.

39. An OFDM receiver, comprising:
means for determining a series of initial channel estimates, each initial channel estimate corresponding to a respective OFDM sub-carriers;
means for compensating phase of at least one of the initial channel estimates to compensate for sampling phase offset;
means for determining whether a received packet effects a data rate greater than 54 Mbps; and
means for further compensating the initial channel estimate to compensate for sampling phase jitter only when received OFDM symbols have a data rate greater than 54 Mbps,
wherein compensating the phase includes estimating a first affine complex number having a nonzero imaginary component directed to the sampling phase offset and carrier frequency offset.

40. An OFDM receiver according to claim 39 wherein the compensating means includes maximum likelihood estimation means for estimating terms A and B, where the compensated channel estimates are given by the equation $$\tilde{H}_k = (A+kB)\hat{H}_k.$$

41. An OFDM receiver, comprising:
means for determining a series of initial channel estimates, each initial channel estimate corresponding to a respective OFDM sub-carriers; and
means for compensating at least one of the initial channel estimates to compensate for sampling phase offset,
wherein the compensating means includes maximum likelihood estimation means for estimating terms A and B, where the compensated channel estimates are given by the equation $$\tilde{H}_k = (A+kB)\hat{H}_k$$

and the maximum likelihood estimation means includes means for calculating $$A = A_{ML} = \frac{m_{22}r_1 - m_{12}r_2}{m_{11}m_{22} - m_{12}^2}$$

$$B = B_{ML} = \frac{-m_{12}r_1 + m_{11}r_2}{m_{11}m_{22} - m_{12}^2} \text{ where}$$

$$m_{11} = \sum_{k \in K} |\hat{H}_k X_k|^2$$

$$m_{12} = \sum_{k \in K} k|\hat{H}_k X_k|^2$$

$$m_{22} = \sum_{k \in K} k^2|\hat{H}_k X_k|^2$$

$$r_1 = \sum_{k \in K} Y_k \hat{H}_k^* X_k^*$$

$$r_2 = \sum_{k \in K} k Y_k \hat{H}_k^* X_k^*$$

and where $X_k$ represents frequency domain data symbols and $Y_k$ represents sub-carrier symbols.

42. An OFDM receiver, comprising:
first logic to determine a series of initial channel estimates, each initial channel estimate corresponding to a respective OFDM sub-carriers;
second logic responsive to said first logic, said second logic to compensate phase of at least one of the initial channel estimates to compensate for sampling phase offset;
third logic to determine whether a received packet effects a data rate greater than 54 Mbps; and
fourth logic to further compensate the at least one of the initial channel estimates to compensate for sampling phase jitter only when received OFDM symbols have a data rate greater than 54 Mbps,
wherein compensating the phase includes estimating a first affine complex number having a nonzero imaginary component directed to the sampling phase offset and carrier frequency offset.

43. An OFDM receiver according to claim 42 wherein said second logic includes fifth logic to estimate terms A and B, where the compensated channel estimates are given by the equation $$\tilde{H}_k = (A+kB)\hat{H}_k.$$

44. An OFDM receiver, comprising:
first logic to determine a series of initial channel estimates, each initial channel estimate corresponding to a respective OFDM sub-carriers; and
second logic responsive to said first logic, said second logic to compensate at least one of the initial channel estimates to compensate for sampling phase offset,
wherein said second logic includes third logic to estimate terms A and B, where the compensated channel estimates are given by the equation $$\tilde{H}_k = (A+kB)\hat{H}_k$$

and said third logic includes logic capable of calculating $$A = A_{ML} = \frac{m_{22}r_1 - m_{12}r_2}{m_{11}m_{22} - m_{12}^2}$$

-continued $$B = B_{ML} = \frac{-m_{12}r_1 + m_{11}r_2}{m_{11}m_{22} - m_{12}^2} \text{ where}$$

$$m_{11} = \sum_{k \in K} |\hat{H}_k X_k|^2$$

$$m_{12} = \sum_{k \in K} k|\hat{H}_k X_k|^2$$

$$m_{22} = \sum_{k \in K} k^2|\hat{H}_k X_k|^2$$

$$r_1 = \sum_{k \in K} Y_k \hat{H}_k^* X_k^*$$

$$r_2 = \sum_{k \in K} k Y_k \hat{H}_k^* X_k^*$$

and where $X_k$ represents frequency domain data symbols and $Y_k$ represents sub-carrier symbols.

45. A computer program stored on a computer readable medium for use by a processor for operating an OFDM receiver, comprising:
   determining an initial channel estimate responsive to a series of training symbols in a preamble of a received packet comprising a series of OFDM symbols;
   compensating phase of the initial channel estimate to adjust for carrier frequency offset;
   further compensating the initial channel estimate to compensate for sampling phase jitter at a receiver A/D converter;
   determining whether the received packet effects a data rate greater than 54 Mbps; and
   executing said further compensating step only when the received OFDM symbols have a data rate greater than 54 Mbps,
   wherein compensating the phase includes estimating a first affine complex number having a nonzero imaginary component directed to the carrier frequency offset and the sampling phase jitter.

46. The computer program of claim 45 wherein said compensating the initial channel estimate to compensate for sampling phase jitter includes determining a specific compensation term for each sub-carrier of the OFDM symbols.

47. The computer program of claim 46 wherein each sub-carrier specific compensation term increases as a function of a sub-carrier index.

48. The computer program of claim 46 wherein each sub-carrier specific compensation term increases linearly with a sub-carrier index.

49. A computer program stored on a computer readable medium for use by a processor for operating an OFDM receiver, comprising:
   determining an initial channel estimate responsive to a series of training symbols in a preamble of a received packet comprising a series of OFDM symbols;
   compensating phase of the initial channel estimate to adjust for carrier frequency offset; and
   further compensating the initial channel estimate to compensate for sampling phase jitter at a receiver A/D converter,
   wherein compensated channel estimates are equal to (A+kB) times the initial channel estimate, where A and B are complex numbers having a nonzero imaginary component and k is a corresponding sub-carrier index, such that A is directed to carrier frequency offset and phase noise while kB increases linearly with sub-carrier index to compensate for sampling phase offsets.

50. A computer program stored on a computer readable medium for use by a processor for operating an OFDM receiver, comprising:
   determining an initial channel estimate responsive to a series of training symbols in a preamble of a received packet comprising a series of OFDM symbols;
   compensating the initial channel estimate to adjust for carrier frequency offset, including determining a specific compensation term for each sub-carrier of the OFDM symbols; and
   further compensating the initial channel estimate to compensate for sampling phase jitter at a receiver A/D converter,
   wherein compensated channel estimates are equal to (A+kB) times the initial channel estimate, where A and B are complex numbers and k is a corresponding sub-carrier index, such that A is directed to carrier frequency offset and phase noise while kB increases linearly with sub-carrier index to compensate for sampling phase offsets, and the information processor calculates maximum likelihood estimates for A and B where the estimates for A and B are determined as $$A = A_{ML} = \frac{m_{22}r_1 - m_{12}r_2}{m_{11}m_{22} - m_{12}^2}$$

$$B = B_{ML} = \frac{-m_{12}r_1 + m_{11}r_2}{m_{11}m_{22} - m_{12}^2} \text{ where}$$

$$m_{11} = \sum_{k \in K} |\hat{H}_k X_k|^2$$

$$m_{12} = \sum_{k \in K} k|\hat{H}_k X_k|^2$$

$$m_{22} = \sum_{k \in K} k^2|\hat{H}_k X_k|^2$$

$$r_1 = \sum_{k \in K} Y_k \hat{H}_k^* X_k^*$$

$$r_2 = \sum_{k \in K} k Y_k \hat{H}_k^* X_k^*$$

and where $X_k$ represents frequency domain data symbols and $Y_k$ represents sub-carrier symbols.

51. The computer program of claim 50, further including code for causing the processor to obtain said maximum likelihood estimates prior to equalization of received signals.

52. The computer program of claim 50, further including code for causing the processor to determine whether the received packet effects a data rate greater than 54 Mbps; and
   executing the steps for compensating the initial estimates only when the received OFDM symbols have a data rate greater than 54 Mbps.

53. A computer program stored on a computer readable medium for use by a processor for operating an OFDM receiver, comprising:
   determining initial channel estimates $\hat{H}_k$ responsive to a series of training symbols in a preamble of a received packet comprising a series of OFDM symbols; and compensating phase of the initial channel estimates according to the equation $$\tilde{H}_k = (A+kB)\hat{H}_k$$

for $-26 \leq k \leq 26$; wherein each of A and B is a complex number having a nonzero imaginary component, thereby determining a specific affine compensation term for each sub-carrier of the OFDM symbols.

54. A computer program stored on a computer readable medium for use by a processor for operating an OFDM receiver, comprising:

determining initial channel estimates $\hat{H}_k$ responsive to a series of training symbols in a preamble of a received packet comprising a series of OFDM symbols; and compensating the initial channel estimates according to the equation $$\tilde{H}_k = (A+kB)\hat{H}_k$$

for $-26 \leq k \leq 26$;

wherein each of A and B is a complex number, thereby determining a specific affine compensation term for each sub-carrier of the OFDM symbols, and the processor implements maximum likelihood estimates for A and B where the estimates for A and B are determined as $$A = A_{ML} = \frac{m_{22}r_1 - m_{12}r_2}{m_{11}m_{22} - m_{12}^2}$$

$$B = B_{ML} = \frac{-m_{12}r_1 + m_{11}r_2}{m_{11}m_{22} - m_{12}^2} \quad \text{where}$$

-continued $$m_{11} = \sum_{k \in K} |\hat{H}_k X_k|^2$$

$$m_{12} = \sum_{k \in K} k |\hat{H}_k X_k|^2$$

$$m_{22} = \sum_{k \in K} k^2 |\hat{H}_k X_k|^2$$

$$r_1 = \sum_{k \in K} Y_k \hat{H}_k^* X_k^*$$

$$r_2 = \sum_{k \in K} k Y_k \hat{H}_k^* X_k^*$$

and where $X_k$ represents frequency domain data symbols and $Y_k$ represents sub-carrier symbols.

55. The computer program of claim 54, further including code for causing the processor to obtain said maximum likelihood estimates prior to equalization of received signals.

56. The computer program of claim 55, further including code causing the processor to process a received packet of OFDM symbols compliant with at least one of IEEE standard 802.11a and proposed standard 802.11g draft D2.8, May 2002.

* * * * *

UNITED STATES PATENT AND TRADEMARK OFFICE
CERTIFICATE OF CORRECTION

PATENT NO. : 7,346,135 B1
APPLICATION NO. : 10/193439
DATED : March 18, 2008
INVENTOR(S) : Ravi Narasimhan It is certified that error appears in the above-identified patent and that said Letters Patent is hereby corrected as shown below:

Column 4, Line 27    " $1\sqrt{4}$ " s/b -- $1\sqrt{42}$ --
Column 8, Line 55    "$|H^k X_k|2$" s/b -- $|H_k X_k|2$ --

Signed and Sealed this

Fifth Day of August, 2008

JON W. DUDAS
*Director of the United States Patent and Trademark Office*